United States Patent [19]

Hamada et al.

[11] Patent Number: 5,867,389
[45] Date of Patent: Feb. 2, 1999

[54] SUBSTRATE PROCESSING MANAGEMENT SYSTEM WITH RECIPE COPYING FUNCTIONS

[75] Inventors: Tetsuya Hamada; Hidekazu Inoue, both of Kyoto, Japan

[73] Assignee: Dainippon Screen Mfg. Co., Ltd., Japan

[21] Appl. No.: 757,069

[22] Filed: Nov. 26, 1996

[30] Foreign Application Priority Data

Nov. 29, 1995 [JP] Japan .................................... 7-335885

[51] Int. Cl.⁶ ..................................................... G06F 19/00
[52] U.S. Cl. .................... 364/468.28; 364/132; 364/134; 364/138; 364/468.02
[58] Field of Search .............................. 364/468.02, 134, 364/468.28, 468.01, 138

[56] References Cited

U.S. PATENT DOCUMENTS 5,231,585   7/1993   Kobayashi et al. ................. 364/468.02
5,699,242   12/1997   Togawa et al. ..................... 364/468.02

Primary Examiner—Reba I. Elmore
Assistant Examiner—Navin Natnithithadna
Attorney, Agent, or Firm—Ostrolenk, Faber, Gerb & Soffen, LLP

[57] ABSTRACT

A substrate processing system includes a plurality of processing stations for processing substrates, and a management station connected with the plurality of processing stations to constitute a computer network. Each processing station includes a plurality of processing units for treating the substrates, first storage device for storing processing recipes, and inter-station recipe copy unit for copying a desired processing recipe from another processing station and storing the copied processing recipe into the first storage device. Each processing recipe defines an order of conveyance of each substrate among the plurality of processing units and processing conditions in each processing unit. The management station includes second storage means for storing processing recipes for the plurality of processing stations, and specification upload/download means for transferring a desired processing recipe between the second storage means and the first storage means included in each of the plurality of processing stations and for storing the transferred processing recipe therein.

8 Claims, 11 Drawing Sheets

SUBSTRATE PROCESSING MANAGEMENT SYSTEM WITH RECIPE COPYING FUNCTIONS

BACKGROUND OF THE INVENTION

1. Field of the Invention

The present invention relates to a substrate processing system with recipe copying function, in which a plurality of processing stations for processing substrates and a management station are mutually connected to one another to comprise a computer network. The substrates include various types such as semiconductor wafers, glass substrates for photo masks, glass substrates for liquid-crystal display devices, and substrates for optical disks.

2. Description of the Related Art

A substrate processing system generally comprises a plurality of processing stations for processing or treating substrates, for example, semiconductor wafers. Each processing station includes a plurality of processing units for coating a resist on a wafer, washing a wafer, carrying out heat treatment, and the like. Each processing station operates according to a processing recipe which defines the order of conveyance of semiconductor wafers to the respective processing units and the processing conditions in each processing unit.

In a conventional system, an operator would take a floppy disk, on which processing recipes are stored, to each processing station and thereby transfer from the floppy disk a desired processing recipe to the processing station. This procedure requires substantial labor and time.

SUMMARY OF THE INVENTION

Accordingly, an object of the present invention is thus to readily provide a desired processing recipe to each processing station.

The present invention is directed to a substrate processing system comprising; a plurality of processing stations for processing substrates, and a management station connected with the plurality of processing stations to constitute a computer network. Each processing station has a plurality of processing units for treating the substrates, first storage means for storing processing recipes, and inter-station recipe copy means for copying a desired processing recipe from another processing station and storing the copied processing recipe into the first storage means. Each processing recipe including an order of conveyance of each substrate among the plurality of processing units and processing conditions in the processing unit. The management station comprises: second storage means for storing processing recipes for the plurality of processing stations, and specification upload/download means for transferring a desired processing recipe between the second storage means and the first storage means included in each of the plurality of processing stations and for storing the transferred processing recipe therein.

Since each processing station has the inter-station recipe copy means, an operator can transfer a desired processing recipe from one processing station to another processing station. Further, since the management station includes the recipe upload/download means, a desired processing recipe can be transferred between the management station and each processing station. This feature enables the operator to transfer a processing recipe from one processing station to another processing station through the operation of the management station. These features of the present invention enable a desired processing recipe to be readily provided to each processing station.

In a preferred embodiment, the management station further comprises; station status display means for taking a processing state of a selected processing station selected by an operator among the plurality of processing stations, and displaying the processing state. This feature enables the operator to monitor the processing state of each processing station through the operation of the management station, without actually going to the processing station.

The management station may include station operating-information logging means for logging historical data of operation of a selected processing station selected by an operator among the plurality of processing stations. This feature enables the operator to obtain the historical operation of each processing station through the operation of the management station, without actually going to the processing station.

The management station may also include station application installing means for installing an applications program from the management station into a selected processing station selected by an operator among the plurality of processing stations. This feature enables a desired application program to be installed into each processing station through the operation of the management station. This remarkably shortens the time required for the installation operation.

These and other objects, features, aspects, and advantages of the present invention will become more apparent from the following detailed description of the preferred embodiments with the accompanying drawings.

DESCRIPTION OF THE PREFERRED EMBODIMENT

A. Structure of System

Figure 1:
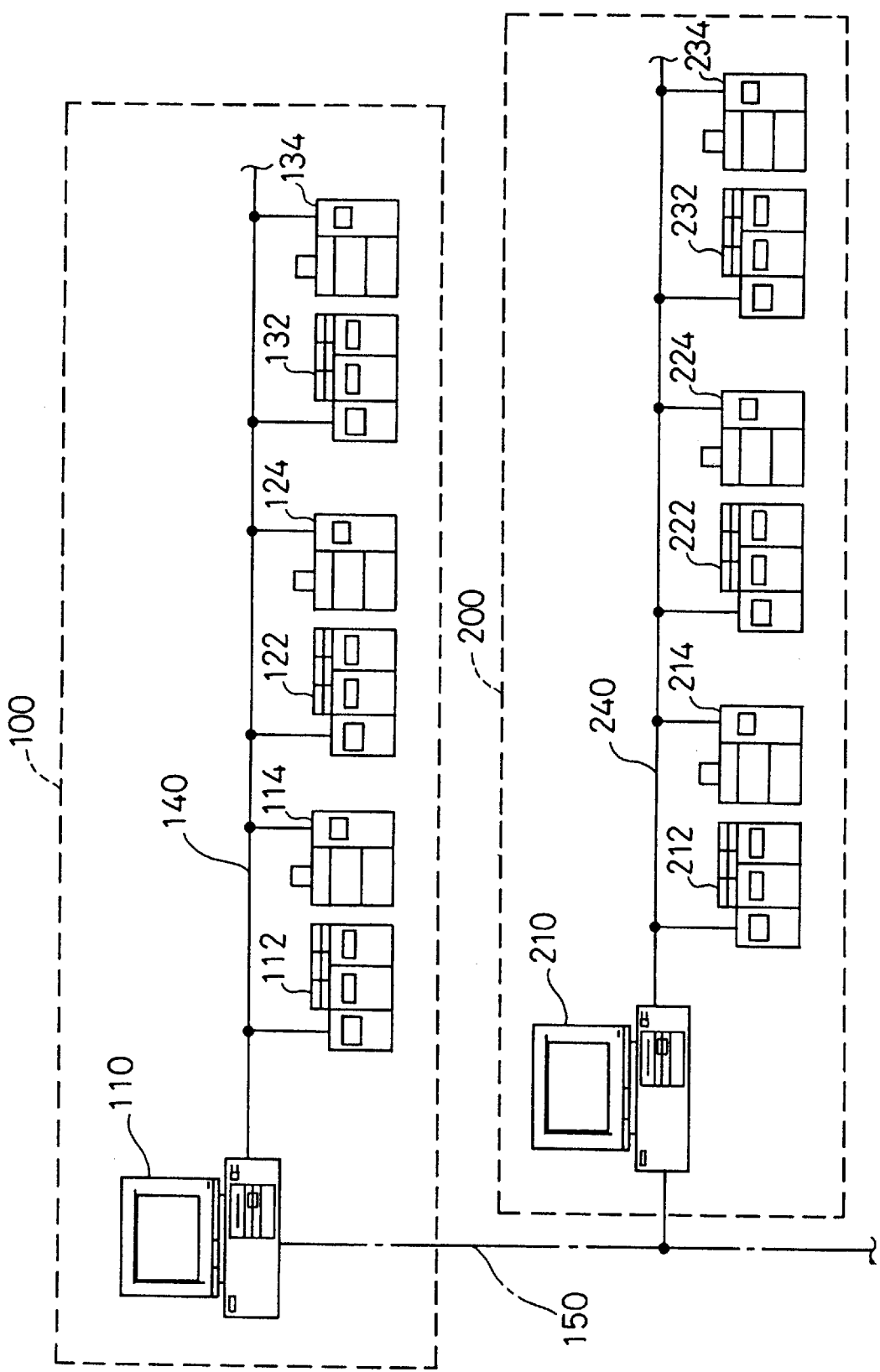
FIG. 1 shows the structure of a substrate processing system embodying the present invention.

FIG. 1 shows the structure of a substrate processing system embodying the present invention. The substrate processing system includes a first network sub-system 100 and a second network sub-system 200. The first network sub-system 100 includes a management station 110, a plurality of processing stations (or resist processing equipment) 112, 122, and 132, and a plurality of exposure stations (or aligners) 114, 124, and 134. The respective stations are mutually connected to one another via a communication path 140 to constitute a local area network. In a similar manner, the second network sub-system 200 includes a management station 210, a plurality of processing stations 212, 222, and 232, and a plurality of exposure stations 214, 224, and 234, wherein the respective stations are mutually connected to one another via a communication path 240 to constitute a local area network. The two management stations 110 and 210 are interconnected by a telephone line 150.

The two management stations 110 and 210 are computer systems operating under an identical network server operating system (for example, Windows NT Server (trademark of Microsoft Corporation)). The respective processing stations and exposure stations include computer systems operating under a network station operating system (for example, Windows NT Station (trademark of Microsoft Corporation)).

Figure 2:
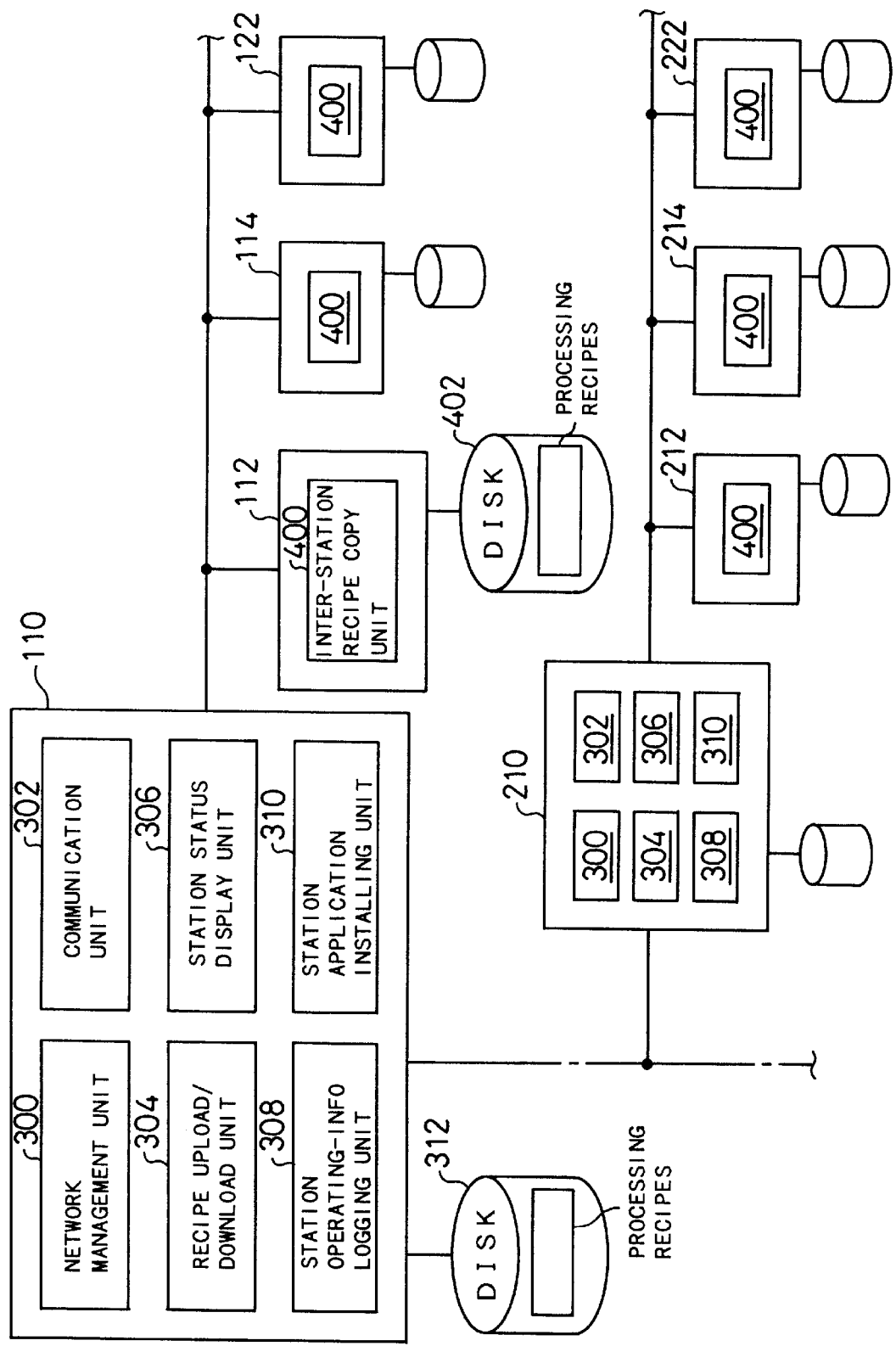
FIG. 2 is a block diagram illustrating the functions of the respective stations shown in FIG. 1.

FIG. 2 is a block diagram illustrating the functions of the respective stations shown in FIG. 1. The first management station 110 comprises a network management unit 300, a communication unit 302, a recipe upload/down load unit 304, a station status display unit 306, a station operating-information logging unit 308, a station application installing unit 310, and a magnetic disk 312 used as an external storage device. The second management station 210 has the same units as the first management station 110. The processing station 112 comprises an inter-station recipe copy unit 400 and a magnetic disk 402 as an external storage device. The other processing stations have the same structure as the processing station 112. A microprocessor, such as a CPU, executes computer program codes to implement the functions of these unit. The detailed functions of these unit will be described later.

Figure 3:
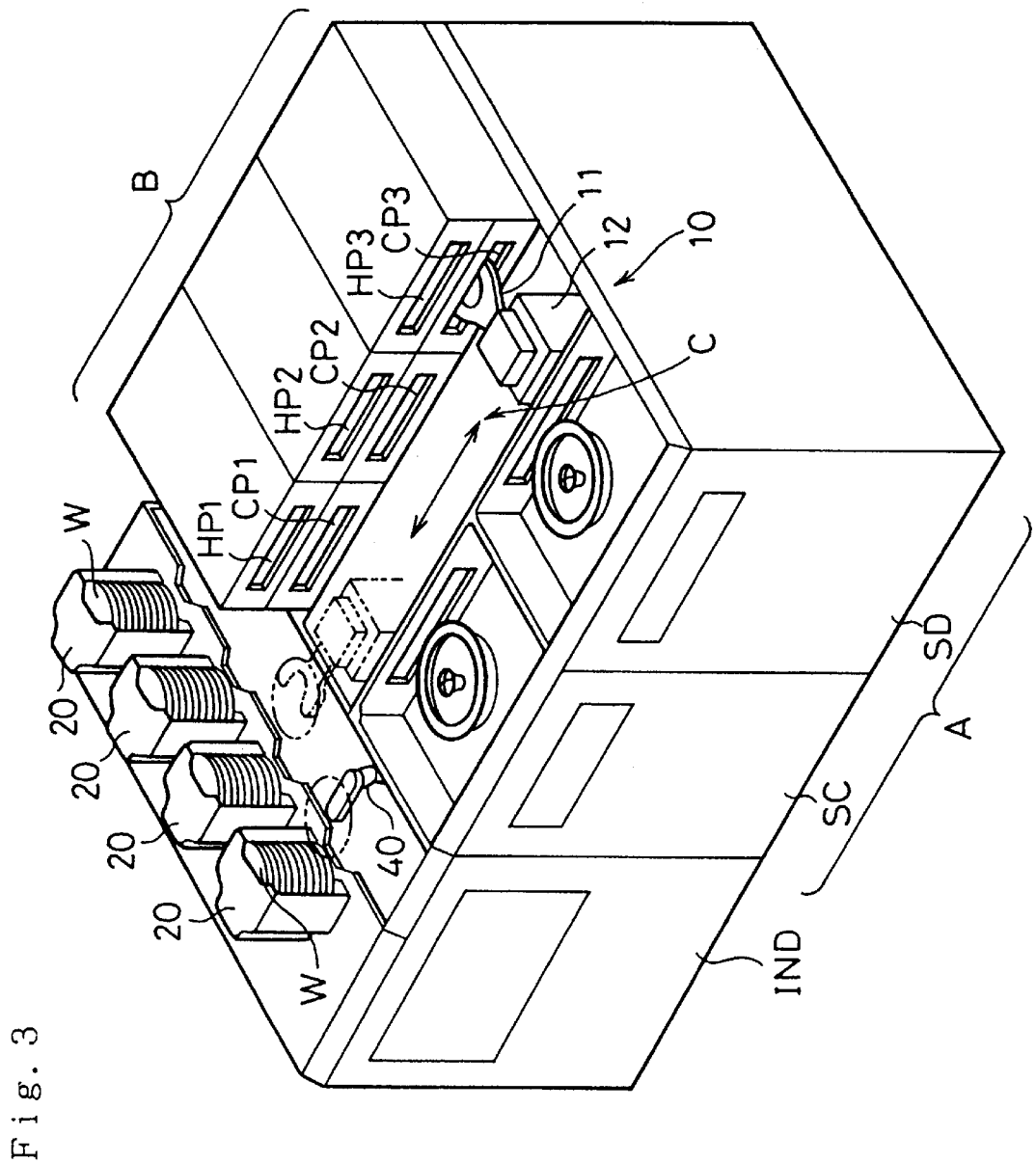
FIG. 3 is a perspective view illustrating an exemplified structure of the processing station.

FIG. 3 is a perspective view illustrating an exemplified structure of the processing station. The processing station comprises a plurality of processing units for carrying out a series of processes (in this embodiment, coating process, developing process, heating process, and cooling process) to treat semiconductor wafers W. A first group of processing units A arranged in a front row include a spin coater SC for executing the coating process and a spin developer SD for executing the developing process.

A second group of processing units B are arranged in a rear row to face the first group of processing units A. The second group of processing units B includes hot plates HP1–HP3 and cool plates CP1–CP3 for heat treatment.

The processing station is further provided with a conveyance area C, which is interposed between the first group of processing units A and the second group of processing units B and extends along the first group of processing units A. A conveyance robot 10 is arranged to be freely movable in the conveyance area C. The conveyance robot 10 includes a movable body 12 having a support member 11 with a pair of arms for respectively supporting the semiconductor wafers W (only one arm is observed in the drawing).

An indexer IND for taking the semiconductor wafers W into and out of a cassette 20 and is disposed at one end of the processing station. A loading robot 40 of the indexer IND takes a non-processed semiconductor wafer W, which has not yet been processed in this processing station, out of the cassette 20 and delivers the non-processed semiconductor wafer W to the conveyance robot 10. The loading robot 40 also receives a processed semiconductor wafer W, which has undergone a series of processes in this processing station, and returns the semiconductor wafer W to the cassette 20. Although not illustrated in FIG. 3, an interface unit for receiving and transferring the semiconductor wafers W from and to an exposure station is disposed at the other end (right-hand end in the drawing) opposite to the indexer IND. In this embodiment, transfer of the semiconductor wafers W between the processing station and the exposure station is carried out by a transfer robot (not shown) mounted on the interface unit in cooperation with the conveyance robot 10.

Figure 4:
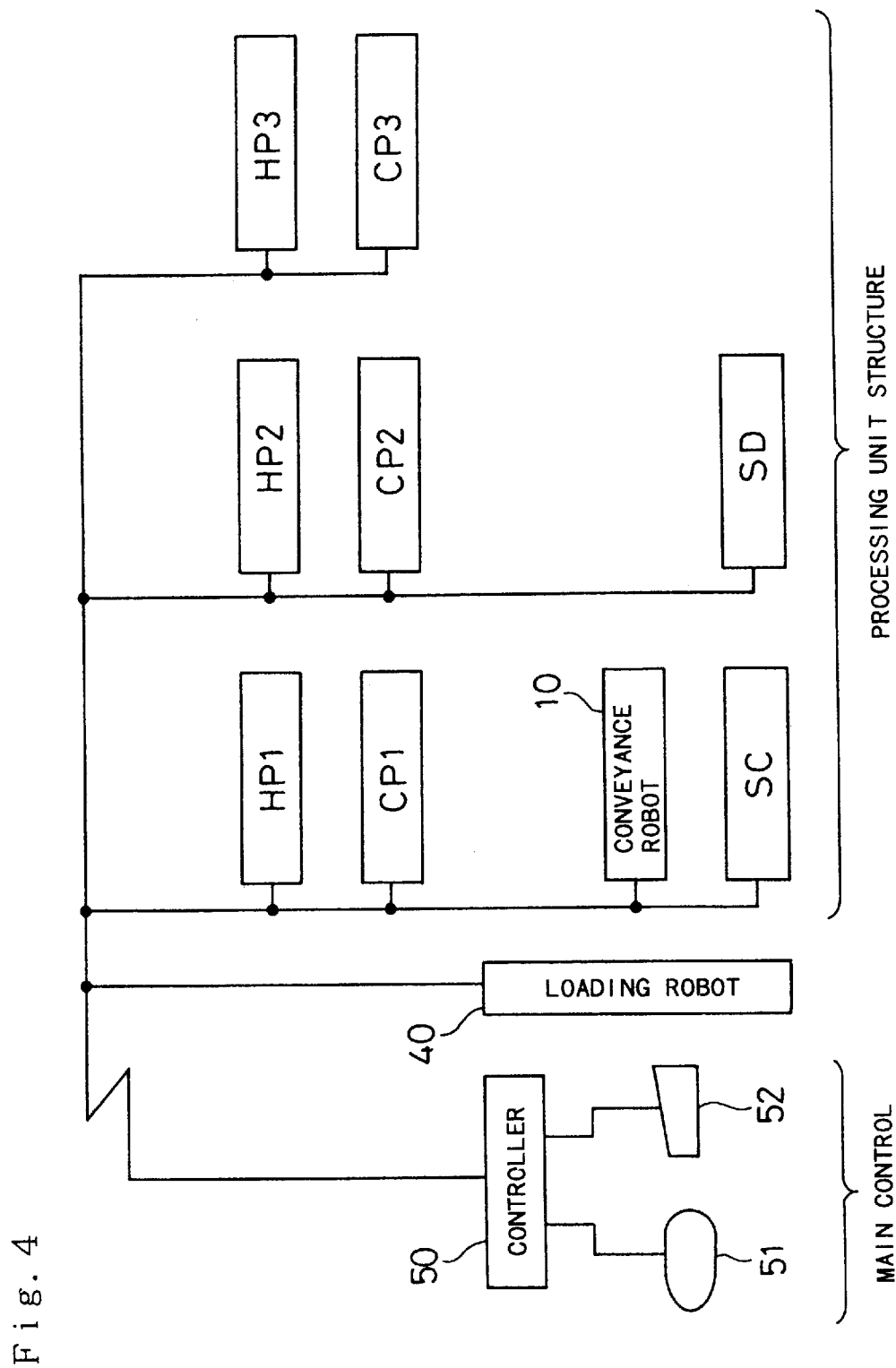
FIG. 4 is a block diagram illustrating the control structure of the processing station of FIG. 3.

FIG. 4 is a block diagram illustrating the control structure of the processing station of FIG. 3. Referring to FIG. 4, a controller 50 is constructed as an arithmetic-logic unit including a central processing unit (CPU) and main memories (RAM and ROM) and is connected with a display 51 and a keyboard 52. The controller 50 controls operations of the conveyance robot 10, the loading robot 40 (robot on the indexer IND), and the respective processing units SC, SD, HP1–HP3, and CP1–CP3 according to a preset processing recipe. The controller 50 further implements a function of the inter-station recipe copy unit 400 (see FIG. 2).

Computer program codes (application programs) indicating the variety of functions of the controller 50 are transferred from a portable storage medium (carriable storage medium), such as a floppy disk and a CD-ROM, to the main memory of the controller 50 or to the magnetic disk 402 (see FIG. 2).

B. Structure of Recipe Data

Figures 5A, 5B, 5C:
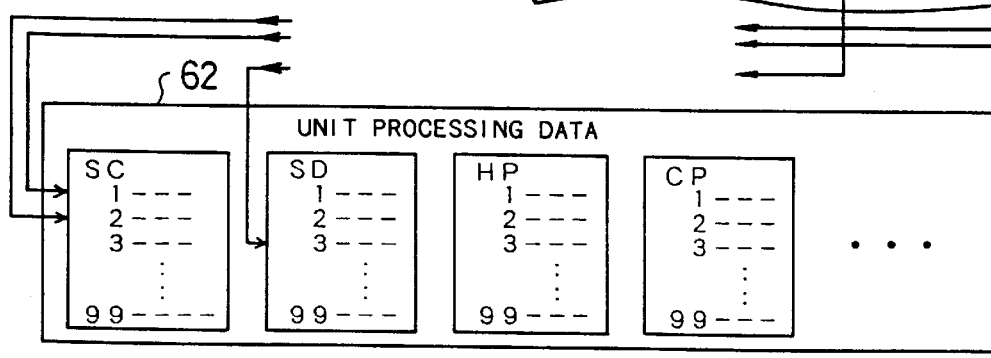
FIGS. 5A–5C show the structure of flow recipe data 60 and unit processing data 62.

FIGS. 5A–5C show the structure of flow recipe data 60 and unit processing data 62 stored in the magnetic disks 312 and 402 (see FIG. 2). Referring to FIG. 5A, the flow recipe data 60 includes flow numbers (also referred to as recipe numbers) and recipe data of the respective flow numbers. In this embodiment, recipe data of fifty different processing flows may be registered in the flow recipe data 60.

FIG. 5B shows the contents of the recipe data of the flow numbers 1 and 2. Each recipe data includes an order of conveyance for transporting each semiconductor wafer to the respective processing units and a unit processing data number in each processing unit. In the order of conveyance shown in FIG. 5B, the symbols 'ID', 'SC', 'SD', and 'HP' respectively denote the indexer ID, the spin coater SC, the spin developer SD, and the hot plates. Since the indexer ID itself does not carry out any processing but is used simply for keeping the semiconductor wafers, no unit processing data number is registered in the indexer ID.

The flow recipe data 60 and the unit processing data 62 constitute one data group for one processing flow. The data group corresponds to the processing recipe of the present invention FIG. 5C shows the contents of the unit processing data 62 with respect to each processing unit. As clearly seen from FIG. 5C, the processing data of each processing unit can be registered irrespective of the order of conveyance, and ninety nine different processing data may be registered for each processing unit. The processing data for the spin coater SC, for example, includes the revolving speed of the spinner, processing time, and spraying time of a chemical. The processing data for the spin developer SD include a revolving speed of the spinner and processing time. The processing data for the hot plate HP or the cool plate CP includes the temperature of the plate and processing time. In this embodiment, the term 'processing data' represents data for controlling each processing unit and may be also referred to as "unit) processing "condition", "(unit) control data", or "(unit) control condition".

C. Functions of Respective unit

Figure 6:
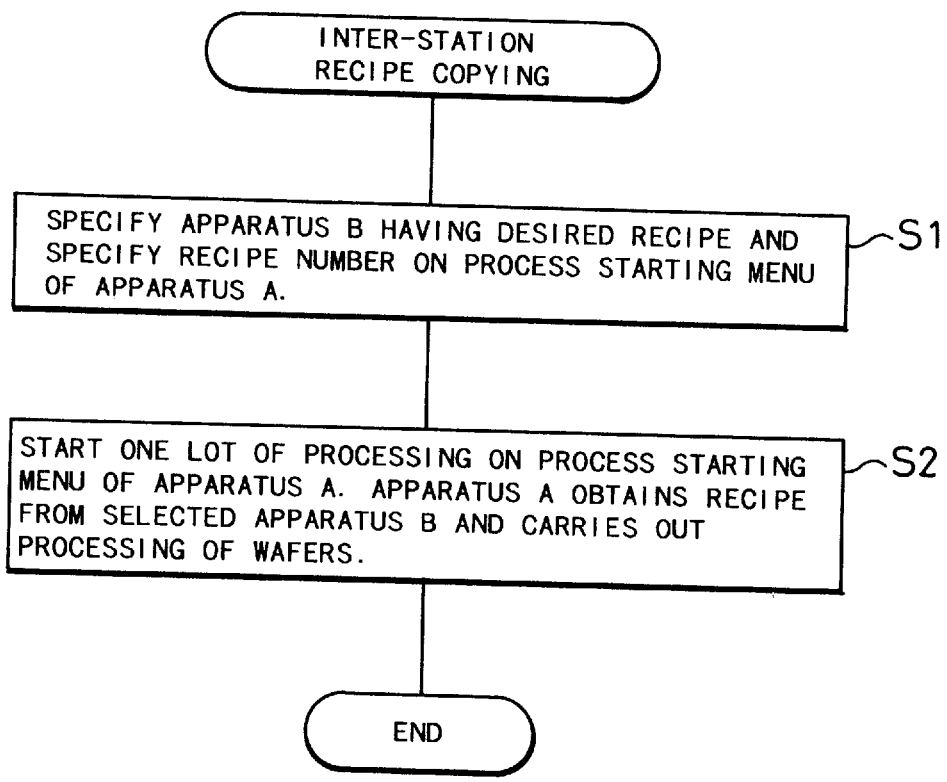
FIG. 6 is a flowchart showing a processing routine executed by the inter-station recipe copy unit 400.

FIG. 6 is a flowchart showing a processing routine executed by the inter-station recipe copy unit 400 (see FIG. 2) of the processing station. In the description below, the processing station is simply referred to as "apparatus. The inter-station recipe copy process represents a process of copying a processing recipe between two processing stations (hereinafter referred to as apparatuses A and B). When the program enters the routine, the operator first specifies an apparatus B having a desired processing recipe and the recipe number on a process starting menu of an apparatus A at step S1. The process starting menu is a first menu for starting the processing at the processing station and is used for setting a processing recipe. In accordance with a concrete procedure of step S1, when the operator specifies another apparatus B, a list of available processing recipes with respect to the apparatus B is displayed on the screen. The operator then selects the recipe number of a desired processing recipe among the available processing recipes displayed.

At subsequent step S2, the operator starts one lot of the wafer processing (one unit of the processing including a plurality of wafers) on the process starting menu of the apparatus A. When a start of the processing is instructed, the apparatus A copies the desired processing recipe from the specified apparatus B and carries out the processing of wafers according to the copied processing recipe. In accordance with a concrete procedure, the inter-station recipe copy unit 400 of the apparatus A requests the inter-station recipe copy unit 400 of the apparatus B to transfer a desired processing recipe. In response to the request, the inter-station recipe copy unit 400 of the apparatus B reads the desired processing recipe from the magnetic disk and transfers the processing recipe to the apparatus A.

This function enables a desired processing recipe to be copied between the processing stations, thereby not requiring the operator to store the processing recipe in a floppy disk or the like and carry the stored processing recipe between the processing stations. Further, since the processing station that actually carries out the processing can request another processing station to transfer a desired processing recipe, the operator can thus readily set a desired processing recipe in the processing station that actually carries out the processing.

Figure 7:
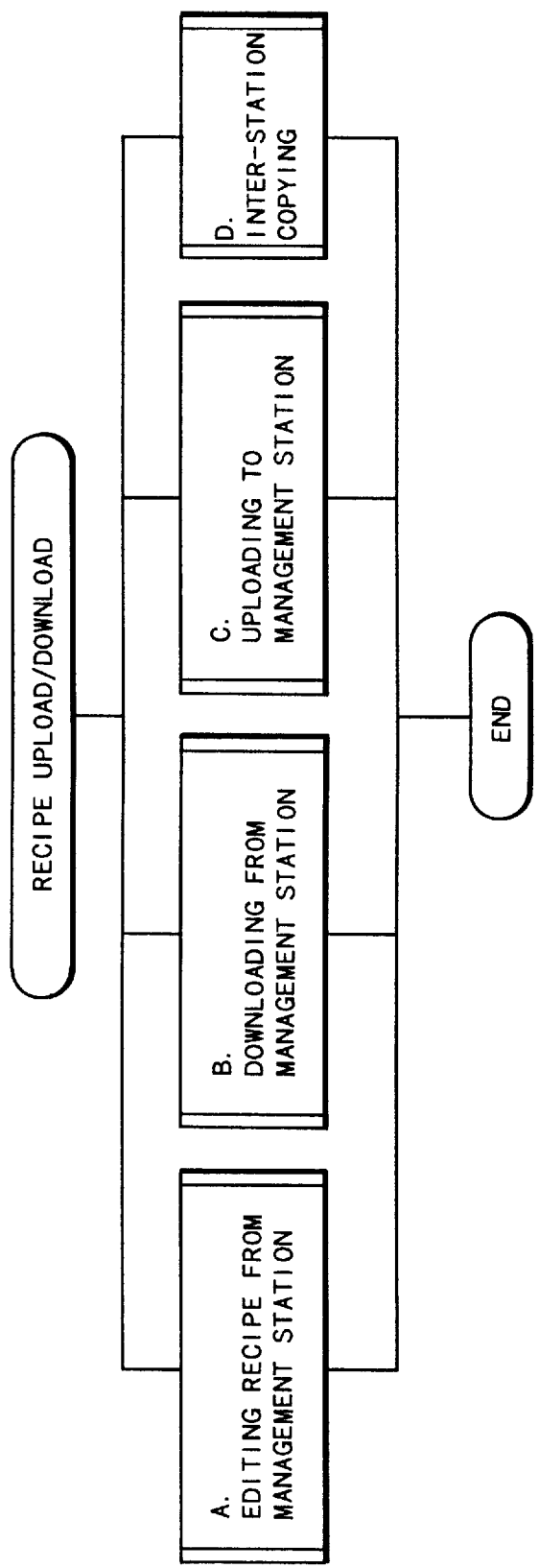
FIG. 7 is a flowchart showing a processing routine of the recipe upload/download unit 304 of the management stations 110 and 210.

FIG. 7 is a flowchart showing a processing routine executed by the recipe upload/download unit 304 of the management stations 110 and 210. The recipe upload/download unit 304 displays four different functions as possible alternatives on the screen of a display device (not shown), and the operator selects one of the four alternatives. The four functions include "A. Editing Recipe from Management Station" "B. Downloading from Management Station", "C. Uploading to Management Station", and "D. Inter-Station Copying".

Figure 8:
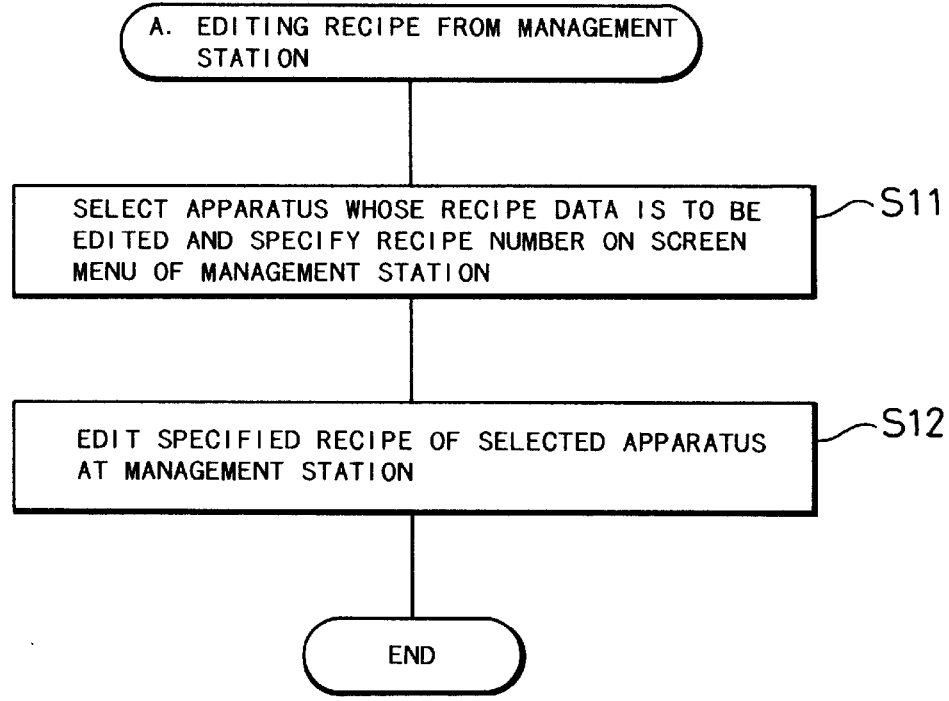
FIG. 8 is a flowchart showing processing steps of the function of "A. Editing recipe from Management Station" executed by the recipe upload/download unit 304.

FIG. 8 is a flowchart showing processing steps of the function of 'A. Editing recipe from Management Station' executed by the recipe upload/download unit 304. At step S11, the operator selects an apparatus, on which a processing recipe is to be edited, and its recipe number on the screen menu of the management station 110. In accordance with a set procedure, when the operator selects one apparatus on the screen menu, a list of available processing recipes stored in the apparatus is displayed. The operator then selects a desired processing recipe among the available processing recipes displayed. This results in transferring the desired processing recipe from the selected apparatus (processing station) to the management station 110 to be displayed thereon.

At subsequent step S12, the operator edits the processing recipe on the screen of the management station 110. The edited processing recipe is inversely transferred from the management station 110 to the selected processing station. This feature enables the operator to edit a processing recipe of each processing station at the management station 110 (or 210) without using the input means of each processing station.

Figure 9:
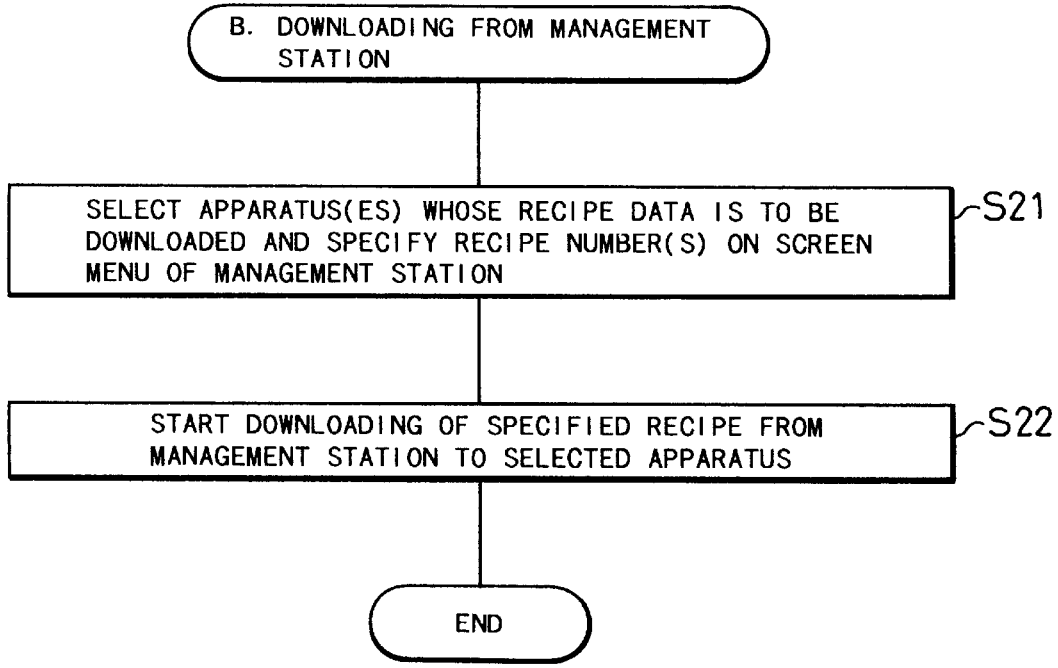
FIG. 9 is a flowchart showing processing steps of the function of "B. Downloading from Management Station" executed by the recipe upload/download unit 304.

FIG. 9 is a flowchart showing processing steps of the function of "B. Downloading from Management Station" executed by the recipe upload/download unit 304. At step S21, the operator selects an apparatus, to which a desired processing recipe is to be downloaded, and specifies a recipe number of a processing recipe to be downloaded among the available processing recipes stored in the magnetic disk 312 of the management station 110. Here a plurality of recipe numbers may be specified if necessary.

At subsequent step S22, the specified processing recipe is downloaded from the management station 110 to the selected apparatus. This function enables the operator to transfer a desired processing recipe selected among a plurality of processing recipes stored in the management station 110 (or 210) to each processing station.

Figure 10:
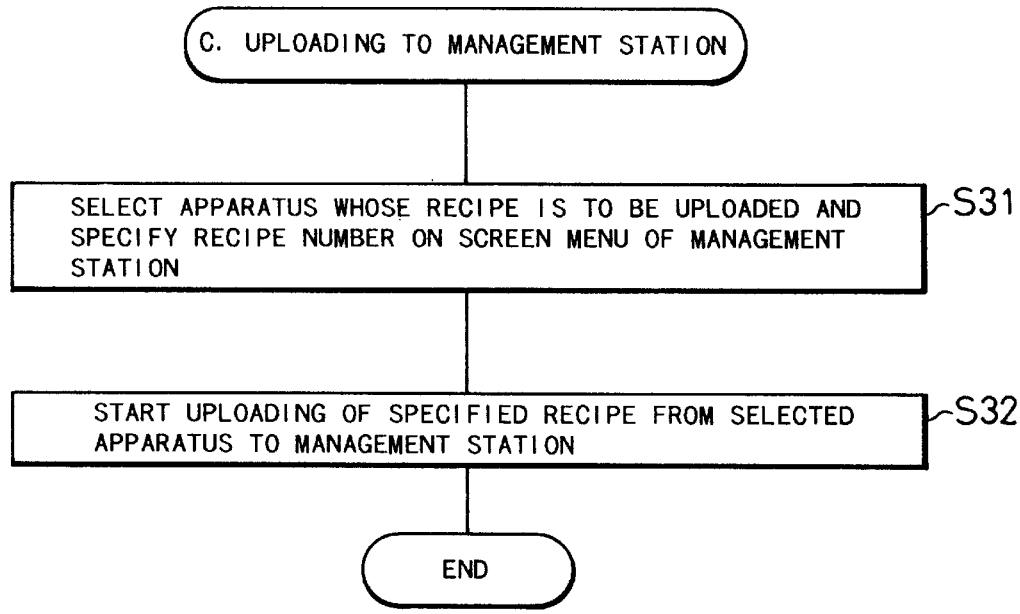
FIG. 10 is a flowchart showing processing steps of the function of "C. Uploading to Management Station" executed by the recipe upload/download unit 304.

FIG. 10 is a flowchart showing processing steps of the function of "C. Uploading to Management Station" executed by the recipe upload/download unit 304. At step S31, the operator specifies an apparatus having a desired processing recipe and its recipe number. In accordance with a set procedure, when the operator selects a processing station on the screen menu of the management station 110, a list of available processing recipes stored in the processing station is displayed. The operator then selects one among the available processing recipes displayed.

At subsequent step S32, the specified processing recipe is uploaded from the selected apparatus to the management station 110. This function enables the operator to transfer a desired processing recipe selected among available processing recipes stored in the plurality of processing stations to the management station 110.

Figure 11:
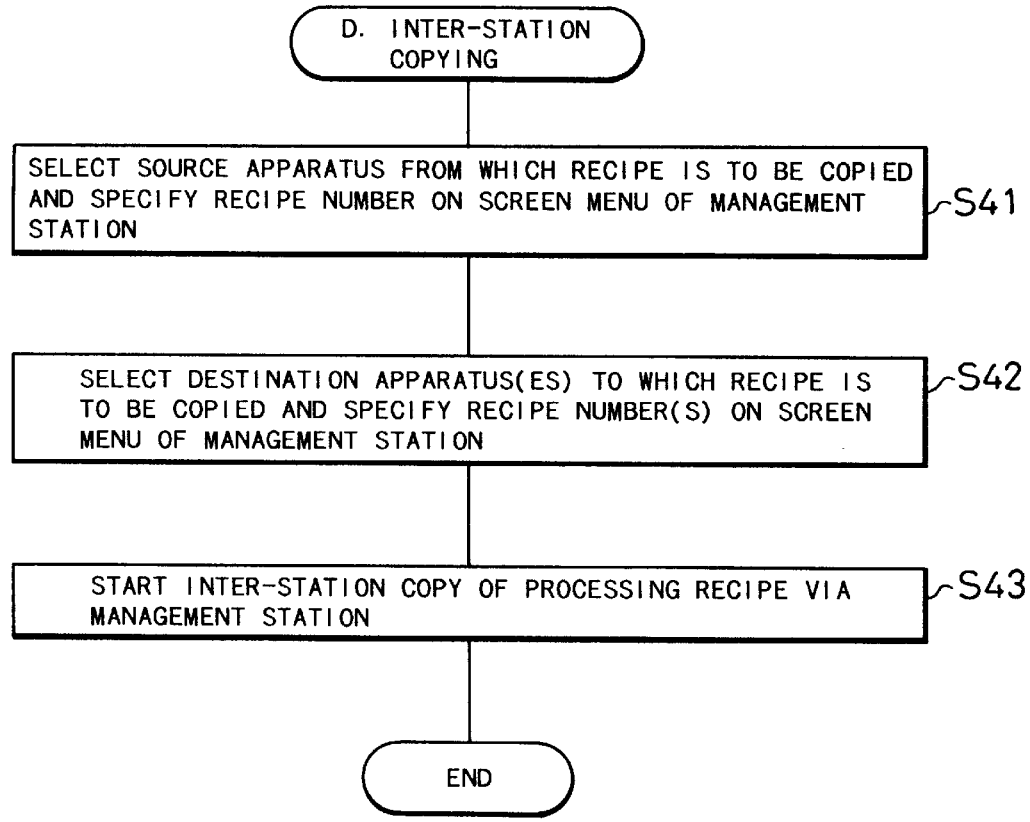
FIG. 11 is a flowchart showing processing steps of the function of "D. Inter-station Copying" executed by the recipe upload/download unit 304.

FIG. 11 is a flowchart showing processing steps of the function of "D. Inter-station Copying" executed by the recipe upload/download unit 304. At step S41, the operator selects an apparatus, from which a desired processing recipe is copied, and its recipe number on the screen menu of the management station 110. At subsequent step S42, the operator selects an apparatus, to which the desired processing recipe is to be copied, and its recipe number on the screen menu of the management station 110. The operator can select a plurality of apparatuses and the recipe numbers for respective apparatuses at step S42. At step S43, the operator requests the management station 110 to start the inter-station copy of the desired processing recipe. In the copying process, the number specified at step S42 is allocated as the recipe number in the apparatus to which the processing recipe is copied.

A difference between the inter-station copying function of FIG. 11 and the inter-station recipe copying function of FIG.

6 is as follows. While the function of FIG. 11 requires the management station 110 to intermediate the transfer of a desired processing recipe, the function of FIG. 6 allows a direct transfer of a desired processing recipe from one processing station to another processing station. In the procedure of FIG. 11, a desired processing recipe is first transferred from the first selected apparatus, from which the processing recipe is to be copied, to the management station and then transferred from the management station to the second selected apparatus to which the processing recipe is to be copied. In the procedure of FIG. 6, on the other hand, a desired processing recipe is directly transferred from one apparatus to another apparatus. The function of FIG. 11 enables the operator to carry out copying of a desired processing recipe between separate apparatuses through the operation of the management station.

Figure 12:
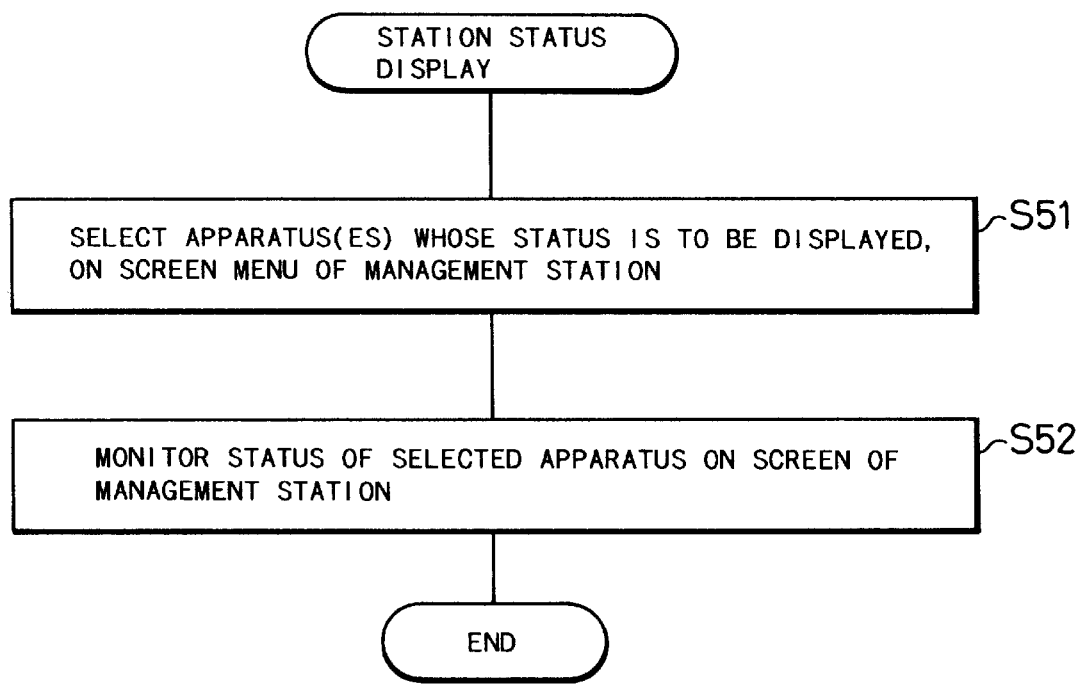
FIG. 12 is a flowchart showing a processing routine executed by the station status display unit 306.

FIG. 12 is a flowchart showing a processing routine executed by the station status display unit 306 of the management station. At step S51, the operator selects an apparatus or processing station, from which a status (current processing state) is to be taken, on the screen menu of the management station 110. Here a plurality of processing stations may be selected if necessary. At subsequent step S52, the status of the selected apparatus is displayed on the screen of the management station 110, and the operator monitors the status and checks for any abnormality. This function frees the operator from the troublesome operation of checking for abnormalities at each processing station, but instead enables the operator to check the status of each processing station through the operation of one management station 110.

Figure 13:
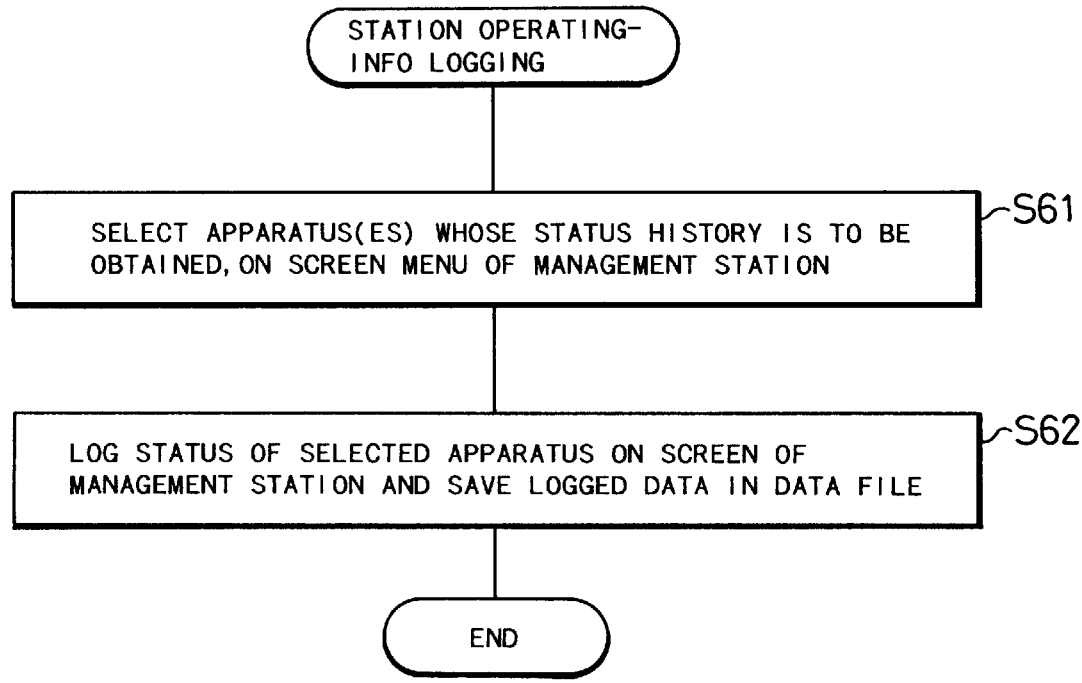
FIG. 13 is a flowchart showing a processing routine executed by the station operating-information logging unit 308.

FIG. 13 is a flowchart showing a processing routine executed by the station operating-information logging unit 308 of the management station. At step S61, the operator selects on the screen menu of the management station 110; an apparatus or processing station from which historical status data is to be taken. Here a plurality of processing stations may be selected if necessary. At subsequent step S62, the management station 110 stores the historical status data with respect to the selected apparatus in the magnetic disk 312 as a status history data file. The status history data includes the time of raising an alarm, the unit that sent the alarm, the extent of processing at each processing unit, and the contents of inner communications (communication between processing units within the same processing station). This function does not require the operator to obtain the historical status data at each processing station, but instead enables the operator to obtain and store such data with respect to each processing station through the operation of one management station 110. Thus, when problems have occurred in one processing station, the operator can check the historical status data of that processing station in the management station 110 to analyze the cause of the problem.

Figure 14:
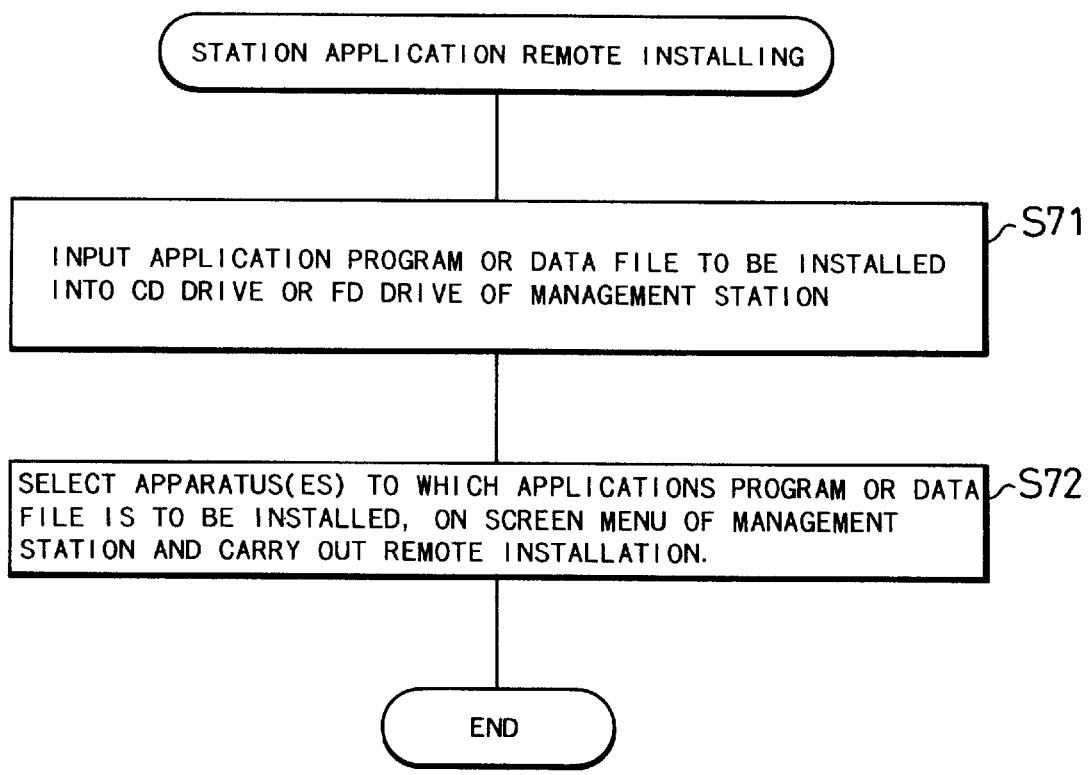
FIG. 14 is a flowchart showing a processing routine executed by the status application installing unit 310.

FIG. 14 is a flowchart showing a processing routine executed by the status application installing unit 310 of the management station. At step S71, the operator inputs an application program or a data file that requires installation into the management station 110 with a portable external storage device (not shown), such as a Compact Disk drive or a Floppy Disk drive, of the management station 110. At subsequent step S72, the operator selects on the screen menu of the management station 110 an apparatus in which the input program or the input file is to be installed. The application program or the data file input at step S71 is then transferred to and installed in the selected apparatus. A a plurality of apparatuses may be selected if necessary. This function enables the management station to carry out installation of application programs and/or data files without interrupting the operation of each processing station. The application programs and the data files can be installed into the respective processing stations from the management station 110, and therefore the operator is not required to carry a portable storage medium, such as a floppy disk or CD-ROM to each processing station. This function remarkably shortens the time required for the installation operation.

The functions of the respective unit of the management station discussed above are generally carried out for the processing stations in the same network sub-system. By using the communication unit 302 of the management stations 110 and 210, however, the management station 110 may implement the functions of the respective unit for the processing stations in a different network sub-system. For example, a RAS (remote access service) function of Windows NT may be utilized as the communication unit 302.

Although the present invention has been described and illustrated in detail, it is clearly understood that the same is by way of illustration and example only and is not to be taken by way of limitation. The spirit and scope of the present invention is limited only by the terms of the appended claims.

What is claimed is:

1. A substrate processing system comprising:
   a plurality of processing stations of the same kind for processing substrates; and
   a management station connected with said plurality of processing stations to constitute a computer network;
   each said processing station including:
      a plurality of processing units for treating the substrate;
      a conveyance unit for conveying the substrates among said plurality of processing units within said processing station;
      first storage means for storing processing recipes, each processing recipe including a conveyance sequence of each substrate through said plurality of processing units and processing conditions for treating substrates in each said processing unit; and
      inter-station recipe copy means for copying a desired processing recipe from another processing station and storing the copied processing recipe into said first storage means; and
   said management station including:
      second storage means for storing processing recipes for said plurality of processing stations; and
      recipe upload/download means for transferring a desired processing recipe between said second storage means and said first storage means included in each of said plurality of processing stations and storing the transferred processing recipe therein.

2. A substrate processing system in accordance with claim 1, wherein said management station further includes:
   station status display means for taking a processing state of a selected processing station selected by an operator among said plurality of processing stations, and displaying said processing state.

3. A substrate processing system in accordance with claim 1, wherein said management station further includes:
   station operating-information logging means for logging historical data of operation of a selected processing station selected by an operator among said plurality of processing stations.

4. A substrate processing system in accordance with claim 1, wherein said management station further includes:

station application installing means for installing an applications program from said management station into a selected processing station selected by an operator among said plurality of processing stations.

5. A substrate processing system comprising:

a plurality of processing stations of the same kind for processing substrates; and a management station connected with said plurality of processing stations to constitute a computer network;

each said processing station including:
- a plurality of processing units for treating the substrates;
- a conveyance unit for conveying the substrates among said plurality of processing units within said processing station;
- a first storage device to store processing recipes, each processing recipe including a conveyance sequence of each substrate through said plurality of processing units and processing conditions for treating substrates in each said processing unit; and
- an inter-station recipe copy unit to copy a desired processing recipe from another processing station and storing the copied processing recipe into said first storage device; and said management station including:
- a second storage device to store processing recipes for said plurality of processing stations; and
- a recipe upload/download unit to transfer a desired processing recipe between said second storage device and said first storage device included in each of said plurality of processing stations and storing the transferred processing recipe therein.

6. A substrate processing system in accordance with claim 5, wherein said management station further includes:
station status display unit to take a processing state of a selected processing station selected by an operator among said plurality of processing stations, and displaying said processing state.

7. A substrate processing system in accordance with claim 5, wherein said management station further includes:
station operating-information logging unit to log historical data of operation of a selected processing station selected by an operator among said plurality of processing stations.

8. A substrate processing system in accordance with claim 5, wherein said management station further includes:
station application installing unit to install an applications program from said management station selected by an operator among said plurality of processing stations.

* * * * *